United States Patent [19]

Oka et al.

[11] Patent Number: 4,652,947
[45] Date of Patent: Mar. 24, 1987

[54] ROTARY ENCODER

[75] Inventors: Shunzo Oka; Futoshi Matsui, both of Hirakata, Japan

[73] Assignee: Matsushita Electric Industrial Co., Ltd., Kadoma, Japan

[21] Appl. No.: 495,435

[22] Filed: May 17, 1983

[30] Foreign Application Priority Data

May 19, 1982 [JP] Japan .................................. 57-85163

[51] Int. Cl.⁴ ........................ G11B 15/02; H01H 9/00
[52] U.S. Cl. ..................................... 360/85; 200/292; 200/303; 360/93
[58] Field of Search ............................. 360/85, 95, 93; 200/292, 303, 155 R, 153 P, 164 R, 336

[56] References Cited

U.S. PATENT DOCUMENTS

| | | | |
|---|---|---|---|
| 3,333,068 | 7/1967 | Maskens | 200/292 |
| 4,275,279 | 6/1981 | Wagatsuma et al. | 200/303 |
| 4,346,269 | 8/1982 | Slavin et al. | 200/303 |
| 4,443,670 | 4/1984 | Nakamura et al. | 200/292 |
| 4,492,994 | 1/1985 | Suda et al. | 360/85 |

Primary Examiner—John H. Wolff
Assistant Examiner—Matthew J. Bussan
Attorney, Agent, or Firm—Cushman, Darby & Cushman

[57] ABSTRACT

A rotary encoder comprises a case containing a rotary brush setting plate and an idler gear which is associated with an inside gear formed on the brush setting plate and a reduction gear contained in the case and connected to a driving shaft penetrating the case. Brushes on the rotary brush setting plate rotatingly slide on the plural pulse producing conductive patterns formed on inside surface of the case, thereby to effect switching in plural modes as the shaft revolves.

3 Claims, 8 Drawing Figures

ROTARY ENCODER

BACKGROUND OF THE INVENTION

1. Field of the Invention

The present invention relates to a rotary encoder which can be used as a mode selector of a mechanical appliance for supplying various mode signals to a microcomputer connected with the mechanical appliance for controlling, for example, a tape driving mechanism of a video tape recorder.

2. Description of the Prior Art

Hitherto, for the mode selector of the video tape recorder, an apparatus using a solenoid or a limit switch linkage apparatus in which a rotational motion, such as, a tape loading motor is converted into a straight-line motion and the straight-line motion is detected by an encoder for straight-line motion, has been used. But the apparatus using the solenoid is disadvantageous in occupies a considerable space and consumes a considerable electric power since electric current is necessary for driving an electromagnetic circuit at all times while the operation is executed. Accordingly, an apparatus which converts a rotational motion into a straight-line motion is more advantageous as to necessary space since only one encoder for straight-line motion is necessary and advantageous also in that the electric power consumption in comparison with the apparatus using the solenoid, since electric current is not necessary while the motor is stopped. However, the apparatus for converting a rotational motion into a straight-line motion is disadvantageous because in a process of assembling a precision appliance, such as a VTR set, an accurate adjustment of an operation timing of the encoder and an operation timing the the loading driving mechanism is necessary, and many assembling processes are necessary.

The disadvantages of the conventional apparatus converting a rotational motion into a straight-line motion are explained in detail as follows referring to FIG. 1 and FIG. 2.

In FIG. 1, a main part of a loading driving mechanism of the conventional VTR is shown. The operation of the loading driving mechanism is explained below. When a rotary shaft 1a of a loading motor rotates, a gear 1 rotates in accordance with the rotation of the rotary shaft 1a and a cam gear 2 which engages with the gear 1 rotates. As a result of the rotation of the cam gear 2, a lower portion 5a of a lever 5 of the loading driving mechanism, the lever 5 being supported by a case 4 of the VTR, comes to parts $A_1$, $B_1$, $A_2$, $B_2$, ..., $A_4$ and $B_4$ of a cam slot 2a of the cam gear 2 in this order. A distance r between the lower portion 5a of the lever 5 and a center 2b of the cam gear 2 is determined responding to the part which $A_1$-$B_4$ of the cam slot 2a and the lower portion 5a comes at. And the lever 5 shifts in an up and down direction A according to the rotational motion of the cam gear 2.

Thus, the rotational motion of the loading motor is converted to a straight-line motion of the lever 5. By the motion of the lever 5, for example, a motion which winds a magnetic tape on a rotational cylinder having a video magnetic head is obtained when a recording operation or a playing back operation is executed.

In the conventional VTR, detecting at which state the loading driving mechanism is at present, namely detecting at which part of $A_1$-$B_4$ of the cam slot 2a, the lower portion 5a of the lever 5 comes, is made by such configuration that an encoder 3, such as a limit switch, for straight-line motion is connected directly to the lever 5, thereby to detect the state by using the shifting distance of the contact member 3a of the encoder 3 in the up and down direction A. FIG. 2 shows the relation between a rotary angle of the rotary shaft 1a of the loading motor and the shifting distance of the contact member 3a of the encoder 3 for straight-line motion. That is, in FIG. 2, an axis of abscissas shows the rotary angle of the rotary shaft 1a of the loading motor and an axis of ordinates shows the shifting distance of the contact member 3a of the encoder 3, and hence, the shifting distance of the lever 5 in the up and down direction A. The part $A_1$ is such region that the encoder 3 is not at an operative state during the while the loading rotary shaft 1a rotates. The reason is that all the portion of the part $A_1$ are at equal distances from the center 2b of the cam gear 2. The part $B_1$ is such region that the contact member 3a of the encoder 3 shifts responding to the rotation of the loading motor, since distances from the center 2b of the cam gear 2 to the various portions of the part $B_1$ are not equal. Other parts $A_2$-$B_4$, operate as same as the parts $A_1$ and $B_1$, respectively.

In such conventional VTR, the encoder 3 should operate very accurately when the rotation angle of the rotary shaft of the loading motor is at the static region $A_1$, $A_2$, ..., $A_5$, which is corresponding to the various modes of the VTR operation. But because of stopping of motion of the lever 5 at the stop regions, $A_1$ to $A_5$, low accuracy of the attaching of the lower portion 5a and the cam slot 2a, and inaccurate attachment of the lever 5 to the case 4, it is very difficult to make the encoder 3 operate accurately at the stop region $A_1$ to $A_5$. Therefore, for example, an assembling of the conventional VTR must include such troublesome process that assembling of the VTR should be made through confirming accuracy of operation of the encoder 3 at each region $A_1$, $A_2$, ..., $A_5$.

Accordingly, if an encoder for detecting the rotational motion is capable of being connected to the loading motor and satisfies required accuracy conditions, the above-mentioned special assembling to include the accuracy confirming and adjustment steps becomes unnecessary, and the assembling processes can be simplified.

SUMMARY OF THE INVENTION

The present invention is intended to provide a rotary encoder capable of resolving the above-mentioned conventional disadvantages.

The present invention enables to omit the accurate adjustment of mechanical relation between the encoder and the loading driving mechanism in the assembly process, by providing in the encoder a rotary shaft which rotates at all times in association with the rotation of the loading motor.

DESCRIPTION OF THE PREFERRED EMBODIMENT

A rotary encoder of the present invention comprises:
a case having an upper plate and a base plate together forming a space therein,
a driving shaft rotatably held in insertion holes formed on the upper plate and on the base plate of the case,
a brush setting plate rotatably held inside the case and having brushes fixed thereon,
a coupling gear fixed to the driving shaft outside the case, for coupling with a gear on a rotary shaft of a motor.
a first reduction gear fixed to the driving shaft inside the case,
a second reduction gear formed on the brush setting plate,
an idle gear rotatably held by a protrusion on the inside wall of the case, in a manner to make gear association between the first reduction gear and the second reduction gear,
a conductive pattern formed on said inside wall of said case, for being slidably touched with brushes,
terminal means fixed on the case and
electric connection means connecting the conductive pattern and the terminal means.

The present invention is elucidated by use of a preferred embodiment.

Figure 1:
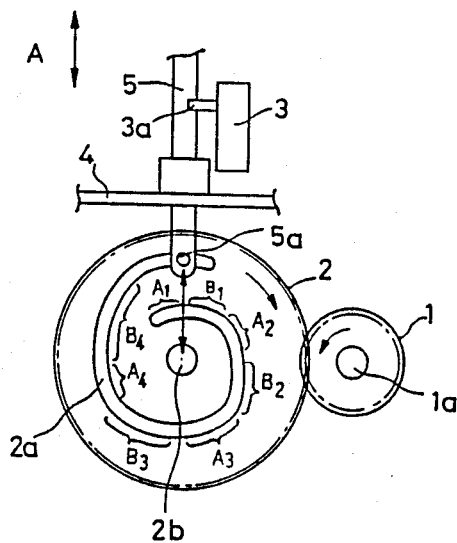
FIG. 1 is the schematic front view showing a main part of a loading driving mechanism of a conventional video tape recorder.
Figure 2:
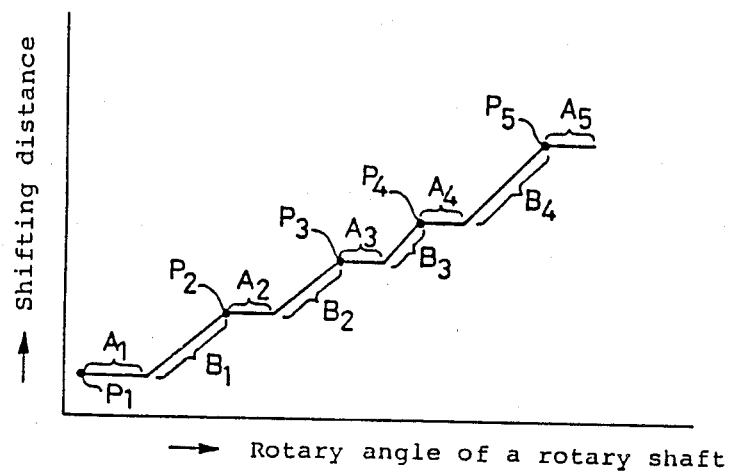
FIG. 2 is the graph showing a relation between a rotary angle of a rotary shaft of a loading motor and a shifting distance of a contact member of an encoder for a straight-line motion.
Figure 3:
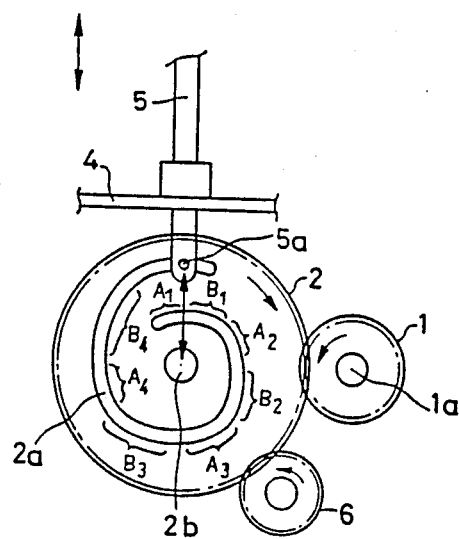
FIG. 3 is a schematic front view showing a main part of a loading driving mechanism of an embodiment of the present invention using an encoder for rotary motion.

FIG. 3 shows a main part of a loading driving mechanism of, for instance, a video recorder embodying a rotary encoder in accordance with the present invention. In FIG. 3 the parts corresponding to those of FIG. 1 are designated by the same numbers as in FIG. 1, and the corresponding parts in FIG. 3 operate in the same manner as mentioned with reference to FIG. 1.

Figure 4:
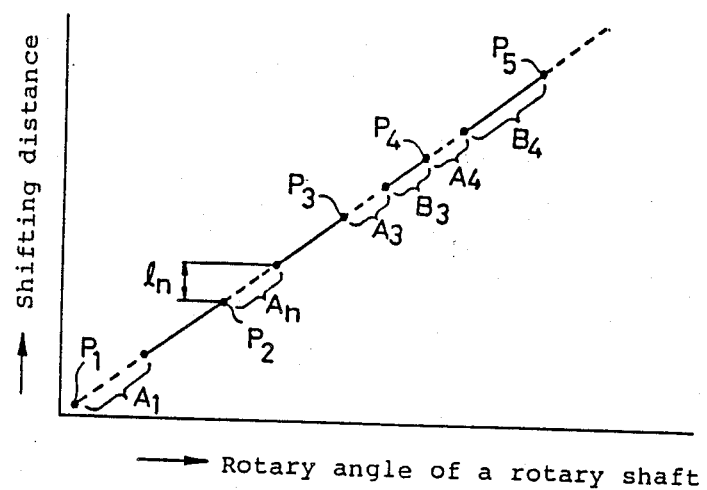
FIG. 4 is a graph showing a relation between the rotary angle of the rotary shaft of the loading motor and a shifting distance of a contact member of the encoder for rotary motion.

In the present invention, for detecting at which state the loading driving mechanism is, namely at which parts $A_1$ to $B_4$ of the cam slot 2a, the lower portion 5a of the lever 5 comes, the encoder 6 is coupled to the cam gear 2, with its driving shaft 11 being engaged with the cam gear 2. The driving shaft 11 does not stop during the while the rotary shaft 1a rotates. Therefore, a contact member of the encoder 6 shifts by a distance ln in the region An (indicated by dotted line) in FIG. 4. That is, the encoder 6 is coupled to the cam gear 2 which is engaged with the gear 1 of the loading motor, the driving shaft 11 being engaged with the cam gear 2. And the encoder 6 is driven by the rotary shaft 1a of the loading motor independently from an operation of the driving lever 5. Accordingly, the contact member of the encoder 6 does not stop its motion when the loading motor rotates. And the contact member of the encoder 6 shifts in a distance ln at the region An (which is indicated by dotted line). As a result, the shifting distance of the contact member of the encoder 6 is always corresponding, one to one, to the rotary angle of the rotary shaft 1a of the loading motor, and the shifting distance of the contact member is in proportion to the rotary angle of the rotary shaft 1a.

Therefore, an assembling of the loading driving mechanism and the encoder 6 is easily and accurately executed without fear of conventional possible error or inaccuracy in the coupling state of the conventional encoder 3 and the lever 5. That is, for example, so long as the encoder 6 can operate certainly at the region $A_1$, the encoder 6 can operate certainly at other region $A_2$, $A_3$, ..., $A_5$.

Figure 5:
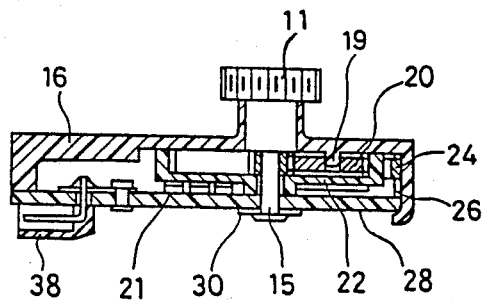
FIG. 5 is a cross-sectional elevation view showing the rotary encoder for the embodiment of the present invention.
Figure 6:
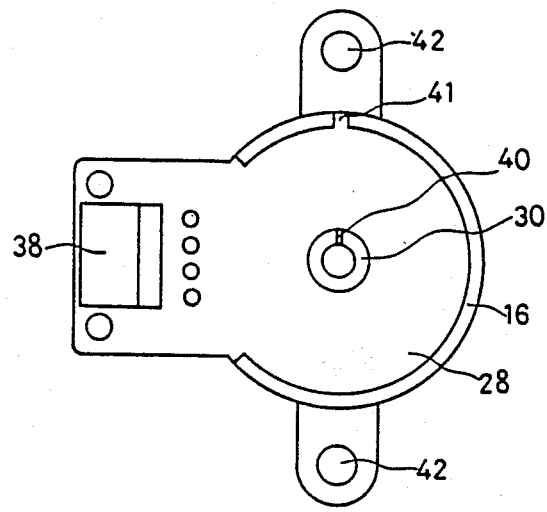
FIG. 6 is a base view showing the encoder for rotary motion of the embodiment of the present invention.
Figure 7:
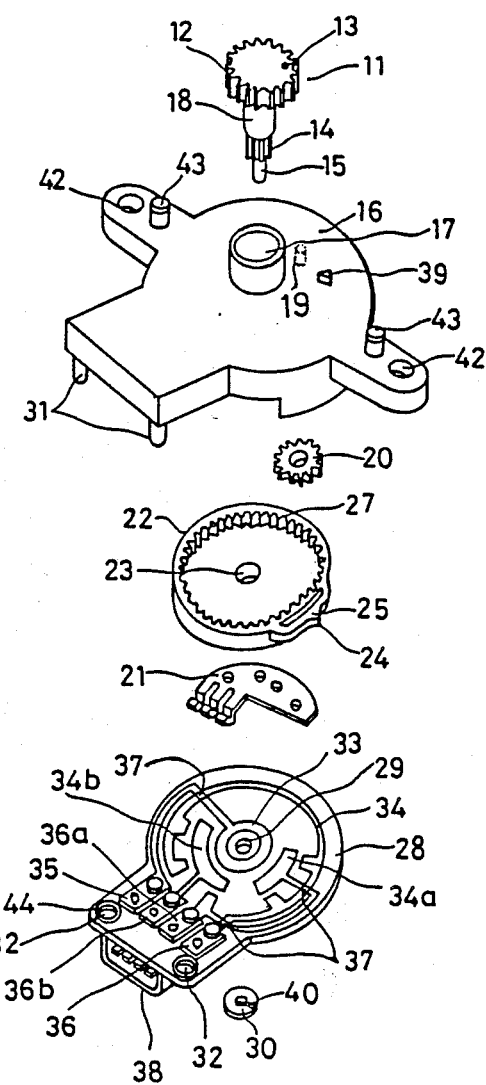
FIG. 7 is an exploded perspective view of the encoder for rotary motion of the embodiment of the present invention.

A detailed explanation of the embodiment of the encoder 6 is set forth as follows referring to FIG. 5–FIG. 7.

The driving shaft 11 is made of resin material, and at its upper peripheral end a coupling gear 12 for coupling with a gear (not shown in FIGS. 5, 6 and 7) fixed to the loading motor of a VTR is formed in one body. On a surface of the coupling gear 12, a first positioning indicator 13 which is used for positioning a start position of the encoder 6, is formed. At a lower end part of the driving shaft 11, a first reduction gear 14 is formed in one body and at a lowest part, a lowest tip 15 is formed in one body. Other parts of the driving shaft 11 than the coupling gear 12 are inserted into and rotatably held by an upper first insertion hole 17 of a resin case 16, and a center part 18 of the driving shaft 11 is rotatably supported by the first insertion hole 17. A first protrusion 19 as a shaft is formed in one body on an inner surface of the upper plate of the case 16, the protrusion protruding downwards in parallel with the driving shaft 11. An idle gear 20 is rotatably held by the protrusion 19 as the shaft and the idle gear 20 is engaged with the first reduction gear 14 of the driving shaft 11.

The lowest edge 15 of the driving shaft 11 is inserted into a center hole 23 of a brush setting plate 22 which is made of insulation material, having a brush 21 on a base surface thereof.

At a part of a peripheral of the brush setting plate 22, a click spring 25 having a dowel 24 for positioning the start position of the encoder 6, is formed in one body. The dowel 24 is designed to be able to be caught in a click groove 26 formed at a part of a side plate of the case 16, so that a rotary position where the dowel 24 is caught in the click groove 26 shows a start position of the encoder 6. The click spring 25 and the click groove 26 constitute click stop means. A second reduction gear 27 is formed on an inner peripheral of the brush setting plate 22. The second reduction gear 27 is engaged with the idle gear 20, which is rotatably held on the protrusion 19, and receives a force from the first reduction gear 14 through the idle gear 20.

The lowest end 15 of the driving shaft 11 is inserted into a second insertion hole 29 of a setting plate 28 made of an insulation material. The setting plate 28 is corresponding to a base plate of the case 16. The tip part of the lowest edge 15 protrudding downwards from the second insertion hole 29 is calked through a washer 30, so as to prevent a falling off of the driving shaft 11 from the case 16. The setting plate 28 is mounted to fit in a lower opening surface of the case 16, and is fixed by inserting plural setting dowels 31, 31 provided in one body on a suitable peripheral part of the opening into case setting holes 32, 32 of the setting plate 28, followed by calking the end tip of the setting dowels 31, 31. The setting plate 28 has a common conductor 33 and pulse conductors 34, 34a and 34b formed with different patterns on the inside face thereof around the second insertion hole 29 by printing with a conductive ink. The conductors 33, 34, 34a and 34b are connected to terminals 35, 36, 36a and 36b. Crossing parts 37, 37, ... of the conductors 33, 34, 34a and 34b are insulated each other using isolation layer. On the conductors 33, 34, 34a and 34b contact parts of the brush 21 slides responding to the rotation of the driving shaft 11. The connector 38 is set on a lower surface of the setting plate 28 and has four pins connected electrically to the terminals 35, 36, 36a and 36b.

Figure 8:
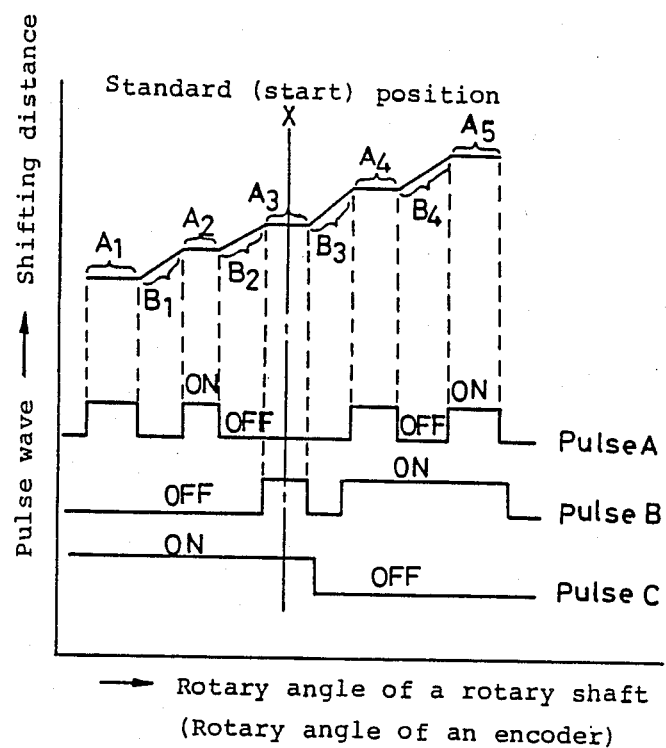
FIG. 8 is a graph showing a relation of the rotary angle of the rotary shaft of the loading motor, the rotary angle of the encoder for rotary motion, the shifting distance of the lever 5 and pulse waves of the encoder.

FIG. 8 shows a relation of the rotary angle of the rotary shaft 1a (the rotary angle of the driving shaft 11) and the shifting distance of the lever 5 and the pulse waves of the encoder 6. One dot chain line X shows a first standard (start) position of the lever 5 and a second standard (start) position for clicking the encoder 6. Pulse wave A, B and C are corresponding to the pulse conductors 34, 34a and 34b, respectively. The pulse waves are supplied into a microcomputer etc., and the microcomputer detects at which position $A_1, A_2, \ldots$ or $A_5$, the lower portion 5a of the lever 5 in FIG. 3 is, namely, at which state the loading driving mechanism is.

A second positioning indicator 39 for positioning the starting position of the encoder 6, is formed on an upper surface of the case 16. The start position is set by fitting the second positioning indicator 39 and the first positioning indicator 13, and furthermore at the same time the dowel 24 of the click spring 25 of the brush setting plate 22 is caught in the click groove 26 formed on the case 16. Thus, the rotary position is observable on the side of the upper surface of the case. A third positioning indicator 40 for positioning the starting position of the encoder 6, is formed on the washer 30 and a fourth positioning indicator 41 for positioning the starting position is formed on a part of the peripheral of the lower opening surface of the case 16. By using the third and fourth positioning indicators 40 and 41, the starting position of the encoder 6 can be set also on the side of the lower surface of the case 16. That is, the first and second positioning indicators 13 and 39 are disposed responding to the third and fourth positioning indicators 40 and 41.

On the case 16, setting holes 42, 42 for setting the case 16 to a chassis of an appliance and a second protrusion 43 for positioning the case 16 to the chassis are formed. The case setting holes 32, 32 are formed when the setting plate 28 is stamped out. At the peripheral of the case setting hole 32, a circular pattern member 44 is formed when the pulse conductors 34, 34a and 34b are formed on the setting plate 28. The circular pattern member 44 is used for an indicator of an eccentricity of the conductors 33, 34, 34a and 34b with respect to the driving shaft 11.

The encoder of the present invention is constituted as above-mentioned and has such effect as follows:

First, since the encoder comprises the rotary driving shaft having a gear which is engaged with the gear of the loading motor, the electric sequence of the encoder can be corresponding, one to one, to the rotary motion of the loading motor. Therefore, an assembling of the loading driving mechanism and the encoder is easy and accurate, without influence of a possible error in the coupling of the conventional encoder 3 and the lever 5.

And, since the conductive patterns are formed using a multilayer interconnection method, complicated patterns can be formed on the same face of a substrate. Therefore, only one encoder can supply several electric sequence signals for different circuits. Furthermore, by utilizing the idle gear the reduction gears having accurate dimensions are assembled compactly.

Further, since the outer positioning indicators are corresponding to the inner click position which is corresponding to the electric sequence of the encoder, the standard (start) rotary position of the encoder can be easily directed to correspond to the standard (start) position of the loading motor. Therefore, the setting of the encoder to the loading driving mechanism is easily executed.

As a result, the assembling of the encoder itself and the coupling of the encoder to the loading motor are easy and accurate. The above-mentioned effects can be realized by using a very compact loading driving mechanism having the encoder. Therefore, the industrial advantage is very great.

What is claimed is:

1. A rotary encoder comprising:
    a case having an upper plate and a base plate together forming a space therein,
    a driving shaft rotatably held in insertion holes formed on said upper plate and on said base plate of said case,
    a brush setting plate rotatably held inside said case and having brushes fixed thereon,
    a coupling gear fixed to said driving shaft outside said case, for coupling with a gear on a rotary shaft of a motor,
    a first reduction gear fixed to said driving shaft inside said case,
    a second reduction gear formed on an inner peripheral of said brush setting plate,
    an idle gear rotatably held by a protrusion on an inside wall of said case, in a manner to be engaged with both of said first reduction gear and said second reduction gear,
    a conductive pattern formed on said inside wall of said case, for being slidably touched with said brushes,
    terminal means fixed on said case and
    electric connection means connecting said conductive pattern and said terminal means,
    wherein said encoder further comprises click stop means comprising one protrusion and a recess, either of which is set on a peripheral of said brush setting plate and the other of which is set on an inner surface of said case.

2. A rotary encoder in accordance with claim 1, wherein
    said conductive pattern comprises at least a common-connection conductor and a pulse-producing conductor, and
    either of said conductors crossing over the other at least at one part on a same plane with an insulator layer inbetween.

3. A rotary encoder in accordance with claim 1, wherein
    a first positioning indicator is formed on said coupling gear disposed outside said case,
    a second positioning indicator is formed on outside surface of said case at part near said coupling gear,
    said first and second positioning indicators being disposed to align with each other when said protrusion of click stop means enters said recess of click stop means.

* * * * *